(12) United States Patent
Ila et al.

(10) Patent No.: US 7,455,526 B1
(45) Date of Patent: Nov. 25, 2008

(54) PICK-AND-PLACE CAP FOR LAND GRID ARRAY SOCKET

(75) Inventors: Alin Ila, Phoenix, AZ (US); Mehdi Imaninejad, Phoenix, AZ (US); Xiaoqing Ma, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/863,810

(22) Filed: Sep. 28, 2007

(51) Int. Cl.
*H01R 13/60* (2006.01)
(52) U.S. Cl. .......................................... 439/41; 439/940
(58) Field of Classification Search .................. 439/41, 439/42, 940, 331
See application file for complete search history.

(56) References Cited

U.S. PATENT DOCUMENTS

| | | | |
|---|---|---|---|
| 6,877,990 B2* | 4/2005 | Liao et al. ...................... 439/41 |
| 6,905,353 B2* | 6/2005 | Ma et al. ....................... 439/135 |
| 6,945,798 B2* | 9/2005 | McClellan et al. ............ 439/135 |
| 6,971,890 B2* | 12/2005 | Ma ............................... 439/135 |
| 7,004,768 B2* | 2/2006 | Ma et al. ....................... 439/135 |
| 7,121,865 B2* | 10/2006 | Bryant .......................... 439/342 |
| 7,429,182 | 9/2008 | Zheng et al. |
| 2004/0053524 A1 | 3/2004 | Trout |
| 2004/0219808 A1 | 11/2004 | McClellan et al. |
| 2005/0208813 A1 | 9/2005 | Trout et al. |

OTHER PUBLICATIONS

Office Action Received for U.S. Appl. No. 11/863,857, mailed (Apr. 1, 2008), 9 Pages.
Notice of Allowance Received U.S. Appl. No. 11/877,919, mailed (May 5, 2008), 7 Pages.

* cited by examiner

*Primary Examiner*—Hae Moon Hyeon
(74) *Attorney, Agent, or Firm*—Grossman, Tucker, Perreault & Pfleger, PLLC

(57) ABSTRACT

Disclosed is an electrical connector assembly. The electrical connector assembly comprises a land grid array socket and the pick-and-placed (PnP) cap. The land grid array socket comprises a socket body and a loading mechanism. The PnP cap is removably attached to the peripheral edge of the socket body for covering a first surface of the socket body. The loading mechanism comprising a loading plate is mounted over the socket body and the PnP cap. The PnP cap detachably engages the loading plate, when the loading plate is mounted over the PnP cap.

10 Claims, 8 Drawing Sheets

CROSS-SECTIONAL SIDE VIEW

CROSS-SECTIONAL SIDE VIEW

PICK-AND-PLACE CAP FOR LAND GRID ARRAY SOCKET

FIELD OF THE DISCLOSURE

The present disclosure generally relates to electrical connector assembly for engaging an integrated circuit package with a printed circuit board, and more particularly, to a pick-and-place cap of the electrical connector assembly for avoiding damage to pins of a land grid array socket of the electrical connector assembly.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

Like reference numerals refer to like parts throughout the description of several views of the drawings.

DETAILED DESCRIPTION OF THE DISCLOSURE

For a thorough understanding of the present disclosure, reference is to be made to the following detailed description, including the appended claims, in connection with the above-described drawings. Although the present disclosure is described in connection with exemplary embodiments, the present disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting. The terms "first," "second," and the like, herein do not denote any order, quantity, or importance, but rather are used to distinguish one element from another, and the terms "a" and "an" herein do not denote a limitation of quantity, but rather denote the presence of at least one of the referenced item.

The present disclosure provides an electrical connector assembly for electrically engaging an Integrated Circuit (IC) package with a printed circuit board (PCB). The electrical connector assembly includes a socket body, a PnP cap and a loading mechanism. The socket body is surface mounted on the PCB and the PnP cap is placed over the socket body for covering a first surface of the socket body. The loading mechanism comprising a loading plate is mounted over the socket body and the PnP cap. The PnP cap includes at least one protrusion configured on a raised portion of the PnP cap to detachably engage the loading plate, when the loading plate is mounted over the PnP cap.

Figure 1A:
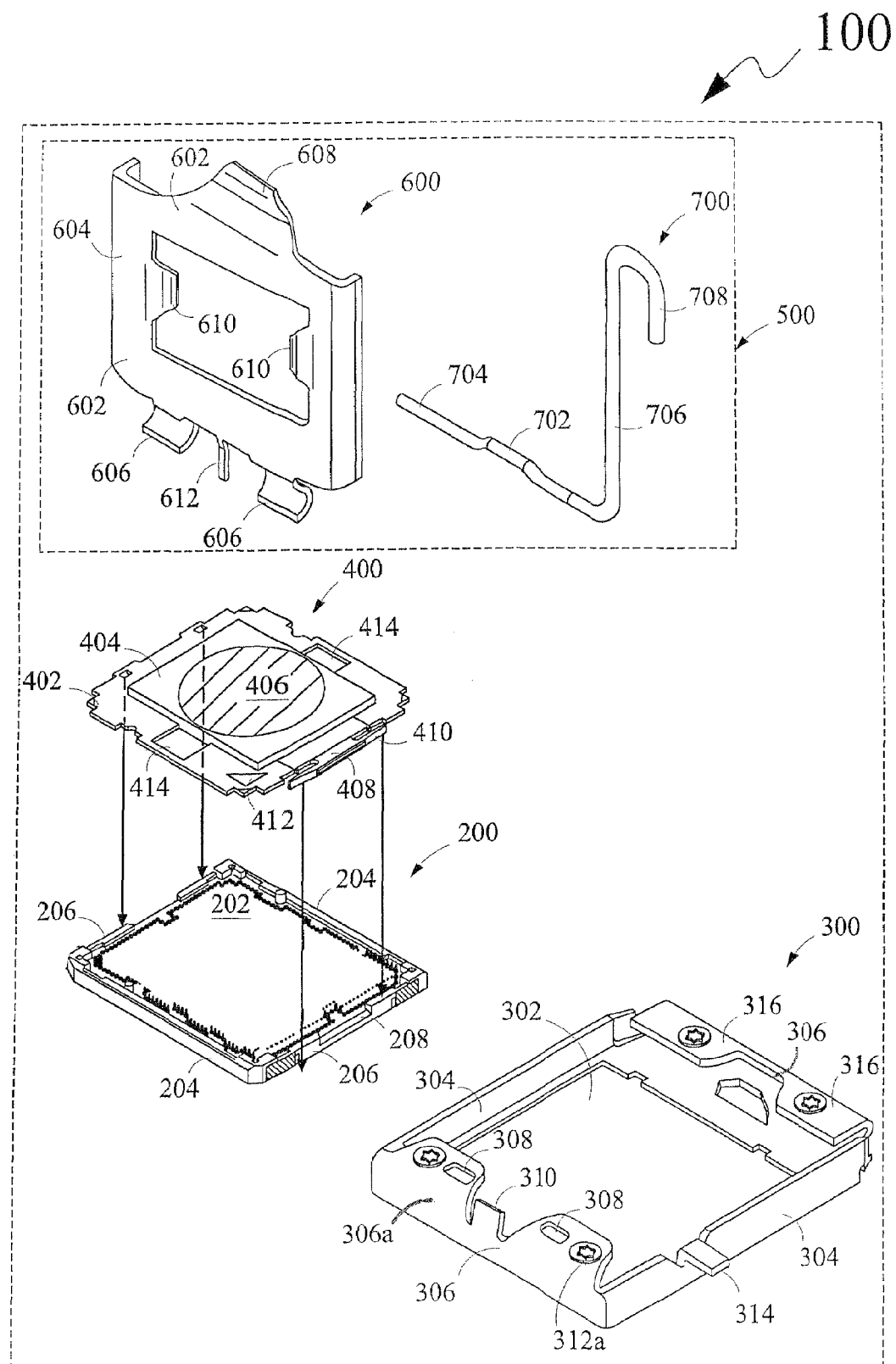
FIG. 1A is a perspective exploded component view of a prior art electrical connector assembly.

FIG. 1A is a perspective exploded component view of a prior art electrical connector assembly 100. The components of the electrical connector assembly 100 include a socket body 200, a socket body frame 300, a conventional pick-and-place (PnP) cap 400 and a loading mechanism 500. The conventional PnP cap 400 is hereinafter referred to as the PnP cap 400. The loading mechanism 500 includes a loading plate 600 and a lever 700. The socket body frame 300 includes a central opening 302 for receiving the socket body 200. The socket body frame 300 with the socket body 200 received therein, is surface mounted on a PCB (not shown in FIG. 1A). The PnP cap 400 may be removably attached to peripheral walls of the socket body 200 and covers a first surface 202 of the socket body 200. The loading mechanism 500 may be mounted on the PnP cap 400 covering the first surface 202 of the socket body 200.

The socket body 200 includes two side walls 204 opposite and spaced apart and two end walls 206 connecting the two side walls 204 in a manner such that the first surface 202, two side walls 204 and the two end walls 206 configure a receiving space therebetween. Such an arrangement of the socket body 200, for example, configures a rectangular structure capable of accommodating an Integrated Circuit (IC) package (not shown in FIG. 1A) therein. The socket body 200 may be surface mounted on a PCB with the first surface 202 facing away from the PCB. The first surface 202 includes an array of contacts configured on the first surface 202 which enable electrical connection when in contact with contact pads on an underside of the IC package. The array of contacts may be of any suitable material such as gold-plated copper and the like. The array of contacts may be arranged in a fashion facilitating electrical connectivity with the contact pads of the IC Package. For example, the array of contacts may be arranged in a grid array fashion.

The first surface 202 of the socket body 200 may be covered by the PnP cap 400 for protecting the array of contacts from contamination from external elements such as air, human-touch and the like. In one embodiment, the PnP cap 400 is configured as a rectangular structure including a top surface 402 having a raised portion 404 and correspondingly a bottom surface (not shown) having a stepped cavity therein. The raised portion 404 configured by the stepped cavity at the bottom surface prevents a planar surface of the PnP cap 400 from coming in contact with the first surface 202 of the socket body 200 when placed thereupon. Further, the raised portion 404 may have a circular smooth area 406 defined in the center of the raised portion 404. The circular smooth area 406 serves to provide sufficient smooth area to suction force applied by a vacuum pump suction for picking up the PnP cap 400 (along with the socket body 200) during the surface mounting process. The PnP cap 400 further comprises a neck portion 408 extending from a peripheral edge of the PnP cap 400 supporting a protrusion 410.

Further, one of the end walls 206 of the socket body 200 defines a groove 208. The groove 208 may be configured to accommodate the neck portion 408 supporting the protrusion 410 extending from the PnP cap 400. The neck portion 408 supporting the protrusion 410 may be dimensioned in a manner such that the neck portion 408 fits the width of the groove 208, thereby latching the PnP cap 400 to the socket body 200. It will be evident to those skilled in the art that peripheral edges of the PnP cap 400 may further include engagement features, such as a plurality of wedges and curved surface edges for coupling the PnP cap 400 to the socket body 200. The socket body 200 may have complimentary engagement features on peripheral edges of the side walls 204 and the end walls 206 for coupling the PnP cap 400 to the socket body 200.

The PnP cap 400 also includes a marker 412 to indicate the correct position of inserting the PnP cap 400 onto the socket body 200. Further, two openings 414 may be provided in the PnP cap 400 adjacent to the raised portion 404 and extending along the peripheral edges of the PnP cap 400. The openings 414 serve as ventilation openings and may improve the air flow into the socket body 200 when the PnP cap 400 is coupled to the socket body 200. The PnP cap 400 may be molded using liquid-crystal-polymer (LCP) and such other material.

The socket body frame 300 includes two side walls 304 opposite and spaced apart and two end walls 306 connecting the two side walls 304 in a manner such that the two side walls 304 and the two end walls 306 configure the central opening 302 therebetween. The socket body 200 is housed in the central opening 302 of the socket body frame 300. Further, one of the end walls 306 (hereinafter referred to as the front end wall 306a) may have two protrusions extending above the socket body frame 300 and curving inwards towards the central opening 302. The two protrusions bear two openings 308 and a nut such as nut 312a each. Further, two grooves (not shown) spaced apart on front end wall 306a define a protrusion 310 therebetween. Further, the socket body frame 300 includes a chip portion 314 extending away from the central opening 302 to hold the lever 700 in a closed position (the closed position is explained in conjunction with FIG. 1B). The socket body frame 300 also includes two protruding portions 316 extending above the socket body frame 300 and curving towards the central opening 302 on opposite end wall of the front end wall 306a. The two protruding portions 316 configure a gap for accommodating rotation of a protruding edge of a shaft of the lever 700. Further, each of the two protruding portions bear a nut such as the nut 312a. The two openings 308 and the protrusion 310 will be explained in conjunction with the loading mechanism 500.

Upon placing the PnP cap 400 covering the first surface 202 of the socket body 200, the loading mechanism 500 is mounted on the PnP cap 400. The loading plate 600 of the loading mechanism 500 may be pivotally connected to the front end wall 306a of the socket body frame 300 and the lever 700 may be pivotally connected at the other of the end walls 306 of the socket body frame 300. The loading plate 600 and the lever 700 may rotate between a first position (hereinafter referred to as an open position) for removing the PnP cap 400 and receiving the IC package, and, a second position (hereinafter referred to as a closed position) for applying a downward force on the PnP cap 400 or on the IC package. The loading plate 600 includes a first pair of arms 602 opposite and spaced apart and a second pair of arms 604 connecting the first pair of arms 602 thereby configuring a central opening (not shown) therebetween. A first arm of the first pair of arms 602 bear a pair of curved protrusions 606 extending away from the first arm and a second arm of the first pair of arms 602 bear a locking portion 608 extending away from the second arm. A pair of pressing portions 610 configured on the second pair of arms 604 in a manner such that the pair of pressing portions 610 extend into the central opening. Further, the loading plate 600 includes a narrow protruding limb 612 extending from the first arm which rests behind the protrusion 310. The pair of curved protrusions 606 is received through the two openings 308 of the front end wall 306a and pivotally hinges the loading plate 600. The narrow protruding limb 612 further facilitates the rotation of the loading plate 600. On removal of the PnP cap 400 and the insertion of the IC package, the pair of pressing portions 610 is capable of applying a downward force on the IC package in the closed position.

The locking portion 608 of the loading plate 600 is a curved surface which rests below a protruding edge 702 of a closing shaft 704 of the lever 700, thereby locking the loading plate 600 in a closed position. A driving shaft 706 is housed outside the socket body frame 300 and runs parallel to the outer periphery of side wall 304 including the chip portion 314 (depicted in FIG. 1B). The driving shaft 706 of the lever 700 includes a u-shaped portion 708 which may be lifted from a horizontal position (closed position) to lift the protruding edge 702 of the closing shaft 704. Accordingly, the protruding edge 702 of the closing shaft 704 is lifted thereby unlocking the locking portion 608 of the loading plate 600 which may then be rotated to assume the open position. The closed position and the open position of the loading plate 600 are depicted in FIG. 1B and FIG. 1C respectively.

Figure 1B:
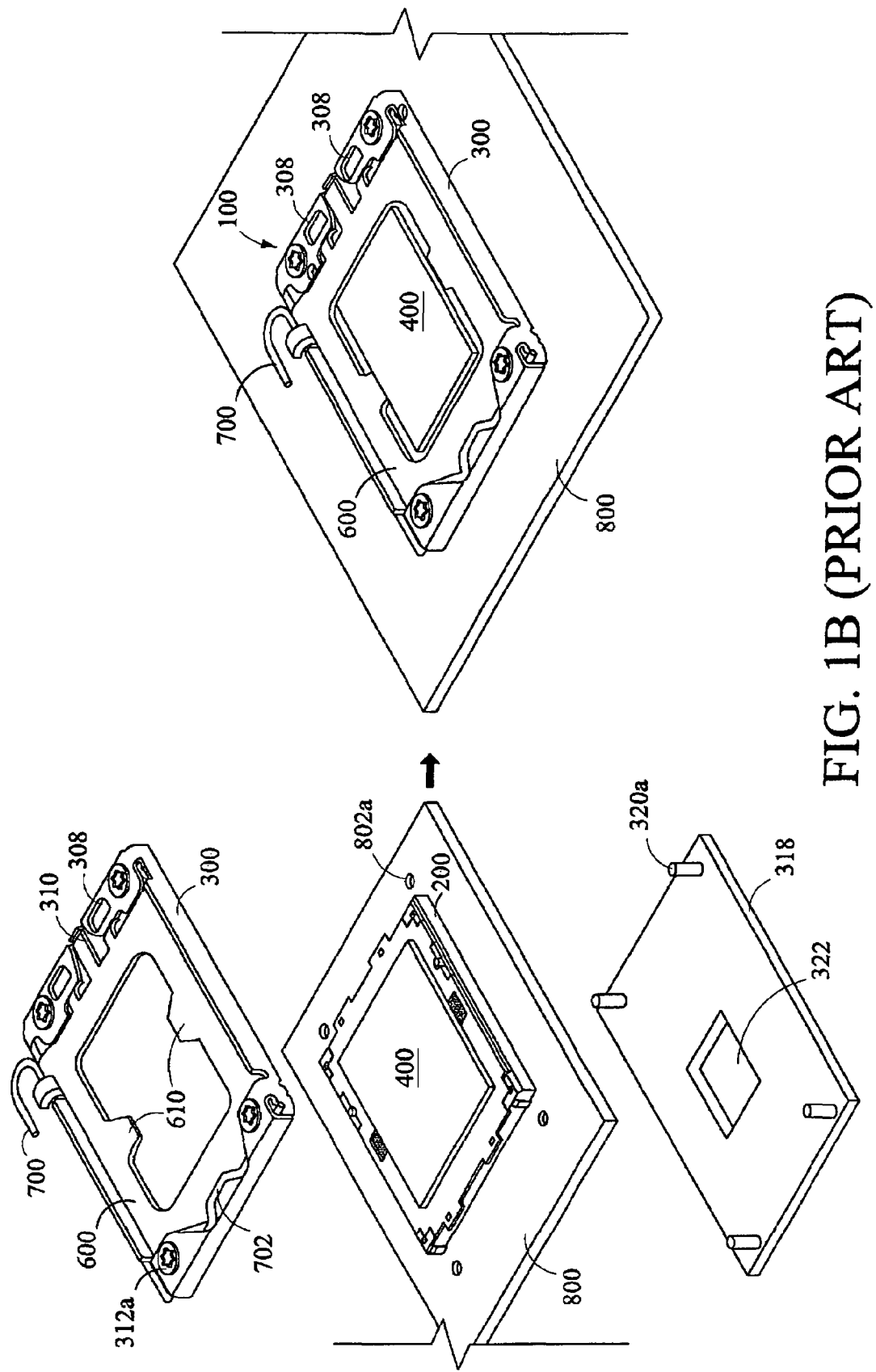
FIG. 1B depicts an arrangement of components of the electrical connector assembly of FIG. 1A on a printed circuit board (PCB)

FIG. 1B depicts an arrangement of components of the electrical connector assembly 100 of FIG. 1A on a printed circuit board (PCB) 800. The socket body 200 is surface mounted on the PCB 800. As explained in conjunction with FIG. 1A, the PnP cap 400 is placed over the socket body 200 for covering the first surface 202 of the socket body 200. The loading mechanism 500 including the loading plate 600 and the lever 700 is shown coupled to the socket body frame 300 for visualization purpose. As explained in conjunction with FIG. 1A, the socket body frame 300 includes nuts such as nut 312a to engage with a back plate 318 through openings, such as punctured opening 802a provided in the PCB 800. The back plate 318 includes studs, such as stud 320a to receive the nuts such as nut 312a and serves to secure the socket body frame 300 firmly in position on the PCB 800. Further, the back plate 318 may include a central opening 322 for receiving a land side cover of the IC package (not shown in FIG. 1B). In one embodiment of the present disclosure, the socket body frame 300 may also be soldered to the PCB 800. An assembled version of the electrical connector assembly 100 on the PCB 800 is further depicted for visualization purposes. The loading plate 600 and the lever 700 are depicted in closed position in the assembled version of the electrical connector assembly 100 on the PCB 800.

The open position of the loading plate is achieved by lifting the driving shaft 706 (to unlock the locking portion 608 of the loading plate 600) and raising the loading plate 600. The open position of the loading plate 600 is illustrated in FIG. 1C.

Figure 1C:
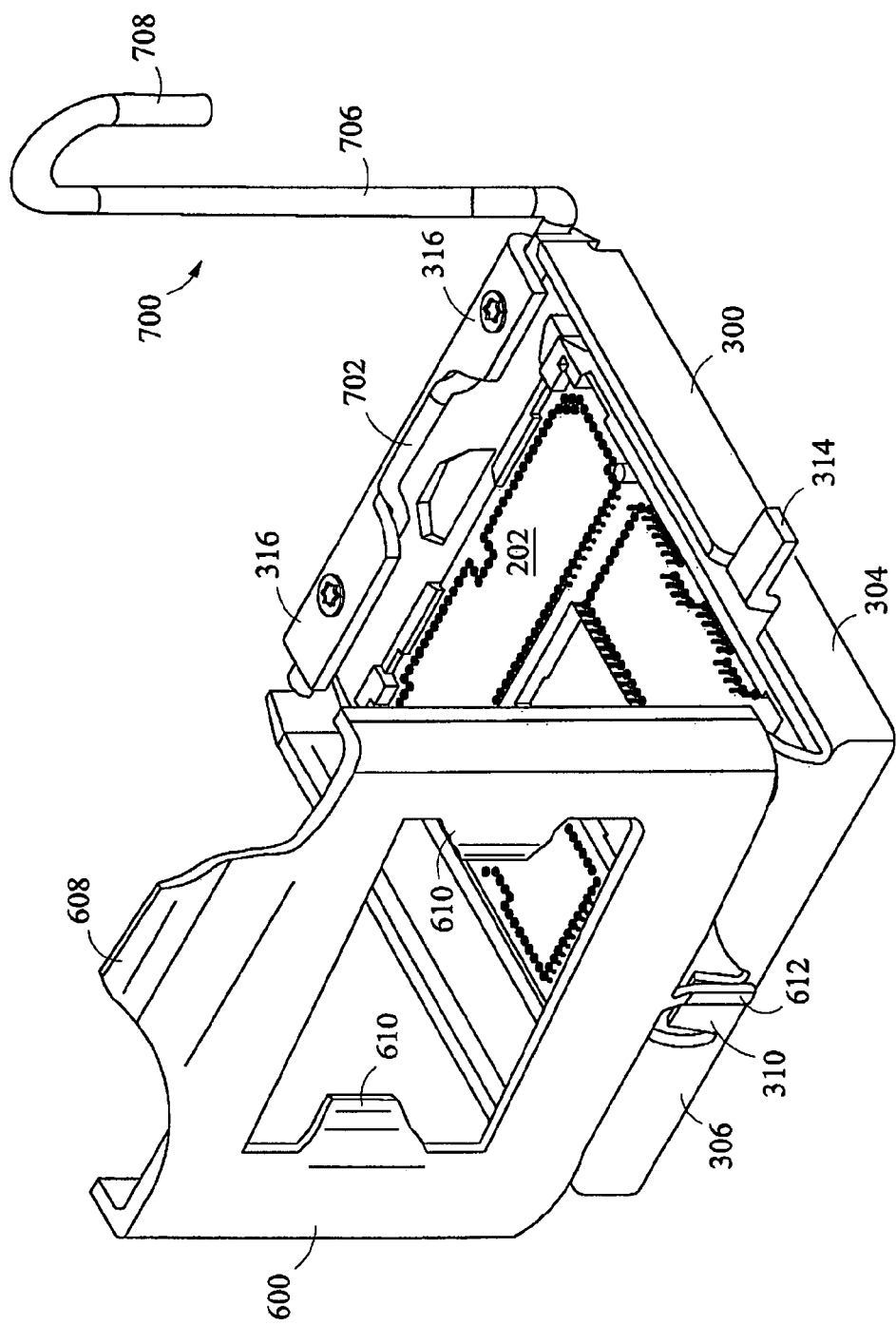
FIG. 1C depicts a first position of a loading plate of the electrical connector assembly of FIG. 1A.

FIG. 1C illustrates a first position (open position) of the loading plate 600 of the electrical connector assembly 100 of FIG. 1A. As explained in conjunction with FIG. 1A, the socket body 200 is housed in the central opening 302 of the socket body frame 300. The loading mechanism 500 including the loading plate 600 and the lever 700 is mounted on the socket body 200. The pair of curved protrusions 606 of the loading plate 600 are pivotally hinged in the openings 308 of the front end wall 306a of the socket body frame 300. The driving shaft 706 comprising the u-shaped portion 708 is lifted from its horizontal position (depicted in FIG. 1B) to lift the protruding edge 702 of the closing shaft 704 thereby releasing the locking portion 608 of the loading plate 600. The loading plate 600 may then be raised to assume the first position (open position). The open position of the loading plate 600 facilitates the removal of the PnP cap 400 (not shown in FIG. 1C) for inserting the IC package into the receiving space of the socket body 200.

Figure 2:
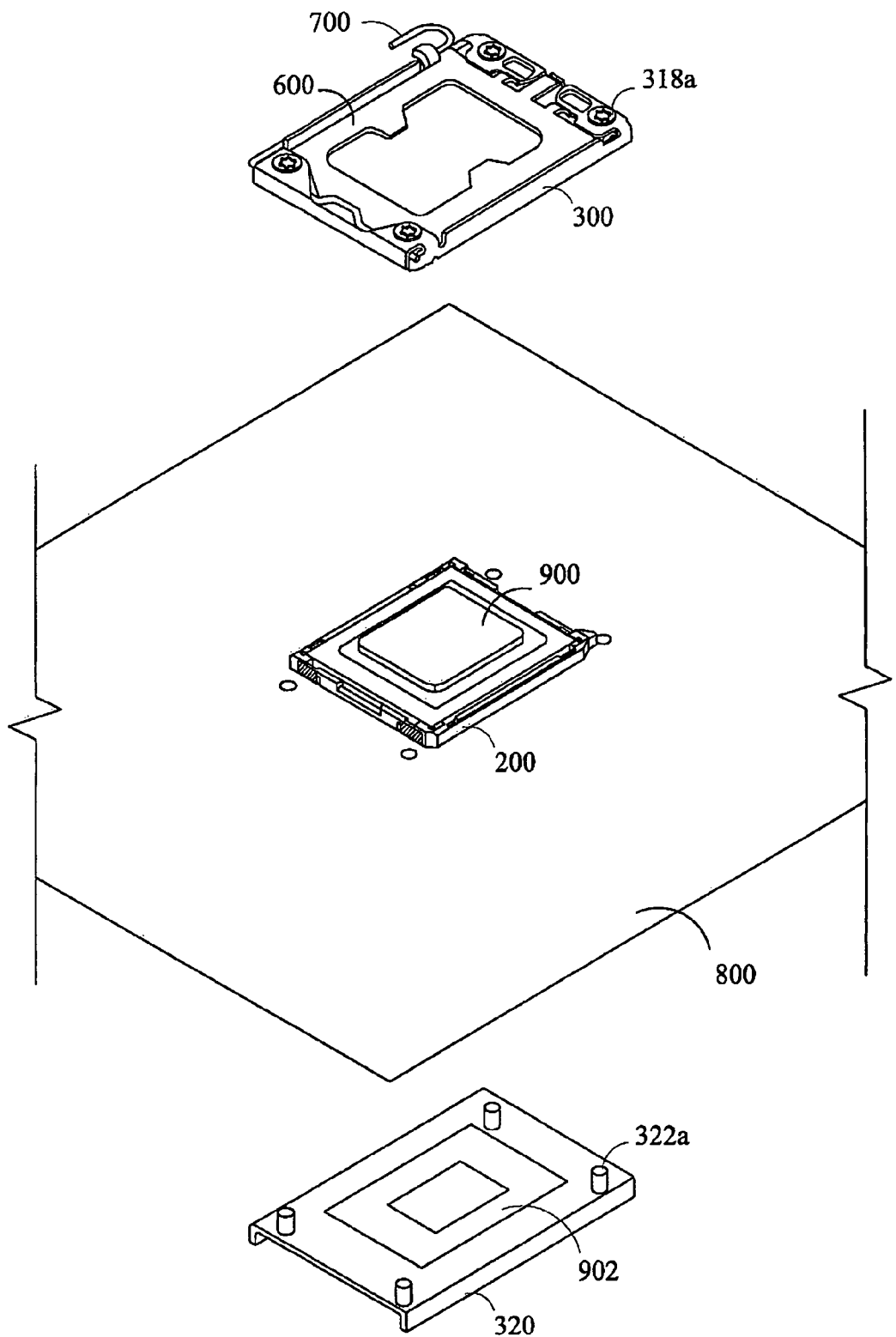
FIG. 2 is an exploded perspective view of an arrangement depicting insertion of an Integrated Circuit (IC) package on to a socket body of the electrical connector assembly of FIG. 1A.

FIG. 2 is an exploded perspective view of an arrangement depicting insertion of an Integrated Circuit (IC) package 900 on to the socket body 200 of the electrical connector assembly 100 of FIG. 1A. As explained in conjunction with FIGS. 1A and 1C, the closing shaft 704 is unlocked and the loading plate 600 is raised to an open position to remove the PnP cap 400. The PnP cap 400 may then be disengaged from the socket body 200 for insertion of the IC package 900. The IC package 900 is housed in the receiving space (not shown in FIG. 2) defined by peripheral walls (the two side walls 204 and the two end walls 206) of the socket body 200. A land side cover 902 of the IC package 900 is housed in central opening 322 of the back plate 318. The loading mechanism 500 along with the socket body frame 300 is fastened to the PCB 800 using nuts such as the nut 312a on the socket body frame 300 and studs such as the stud 320a on the back plate 318. The loading plate 600 is then lowered to assume the closed position. In the closed position, the pair of pressing portions 610 apply a downward force on the IC package 900 to enable sufficient contact of the IC package 900 with the array of contacts on the first surface 202 of the socket body 200.

In accordance with an embodiment of the present disclosure, the IC package 900 may be a flip-chip land gird array package (FC-LGA) package. As described in conjunction with FIG. 1A, the PnP cap 400 protects the array of contacts from contamination from external environment. The PnP cap 400 is explained further in detail in conjunction with FIG. 3.

Figure 3:
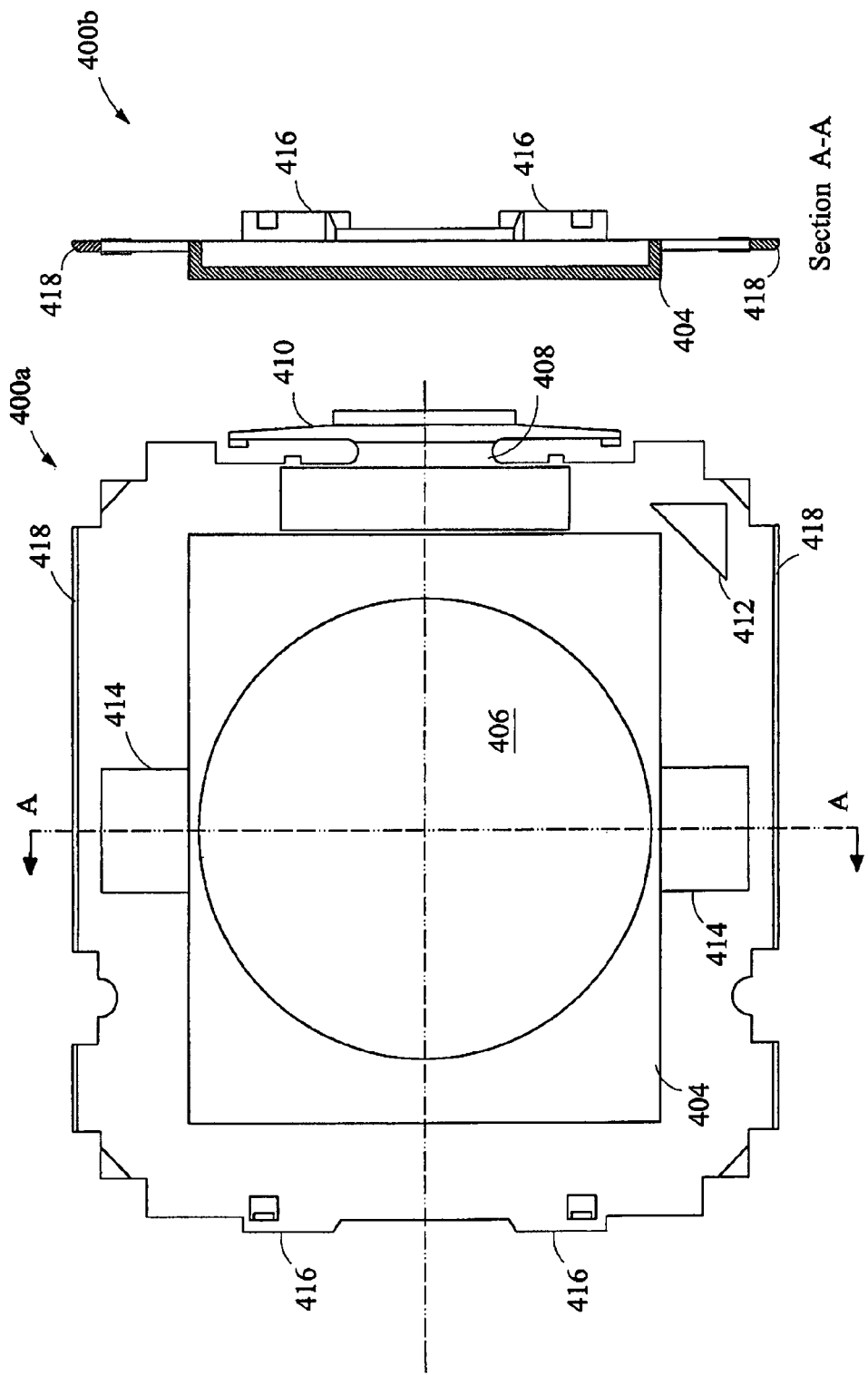
FIG. 3 depicts a top view and a cross sectional view along a line A-A of a conventional pick-and-place (PnP) cap, respectively.

FIG. 3 depicts a top view 400a and a cross sectional view 400b along a line A-A of the conventional pick-and-place cap 400 (PnP cap 400) respectively. The top view 400a of the PnP cap 400 depicts the raised portion 404, the circular smooth area 406 in the center of the raised portion 404, the protrusion 410 supported on the neck portion 408, and a plurality of wedges and curved surface edges on the peripheral edges of the PnP cap 400. As explained in conjunction with FIG. 1A, the protrusion 410 latches the PnP cap 400 to the socket body 200 by coupling the neck portion 408 of the protrusion 410 with the groove 208 of the socket body 200. Further, the PnP cap 400 includes two C-Shaped protrusions 416 which extend outwards from a peripheral edge opposite to the edge having the protrusion 410 and curve downwards and inwards towards the PnP cap 400. The C-Shaped protrusions 416 are slotted in openings provided on one of the end walls 206 of the socket body 200 to further latch the PnP cap 400 to the socket body 200. Moreover, as explained in conjunction with FIG. 1A, the engagement features such as the plurality of wedges and curved surface edges on the peripheral boundary of the PnP cap 400 couple with complementary engagement features on the peripheral edges of the side walls 204 and the end walls 206 of the socket body 200 to couple the PnP cap 400 to the socket body 200. The protrusion 410, the C-shaped protrusions 416 and the plurality of wedges and curved surface edges firmly secure the PnP cap 400 to the socket body 200. The top view 400a further depicts a marker such as marker 412 and two openings such as openings 414.

The cross sectional view 400b is taken along line A-A (shown in top view 400a) of the PnP cap 400. Further, a chamfered edge 418 indicates a tapering of a pair of opposite peripheral edges of the PnP cap 400. The chamfered edge 418 facilitates coupling of the PnP cap 400 with the socket body 200. Further, the C-shaped protrusions 416 curving downwards and inwards are also depicted in the cross sectional view 400b. The arrangement of the loading plate 600 on the PnP cap 400 is explained in conjunction with FIG. 4.

Figure 4:
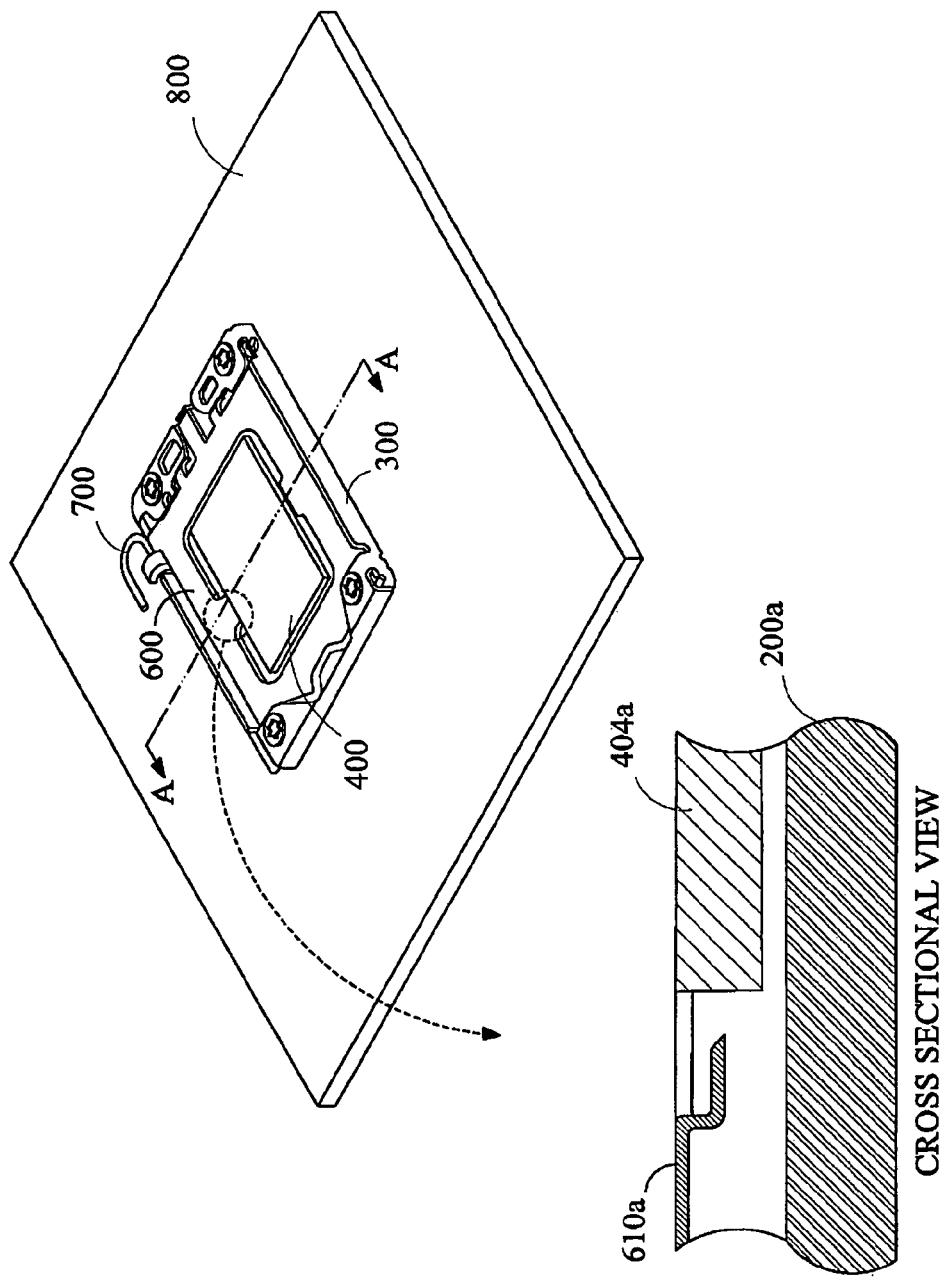
FIG. 4 illustrates an enlarged cross-sectional view of a prior art arrangement of a pair of pressing portions of the loading plate and the conventional PnP cap when the loading plate is coupled to the conventional PnP cap.

FIG. 4 illustrates an enlarged cross-sectional view of a prior art arrangement of the pair of pressing portions 610 of the loading plate 600 on the PnP cap 400. The electrical connector assembly 100 explained in conjunction with FIG. 1B is depicted in FIG. 4 for reference purposes. The cross-sectional view taken along A-A depicts the prior art arrangement in further detail. A shaded portion 404a depicts a cross-sectional view of the raised portion 404 of the PnP cap 400. The shaded portion 200a depicts a cross-sectional view of the socket body 200 being covered by the PnP cap 400. A shaded portion 610a depicts a cross-sectional view of a pressing portion of the pair of pressing portions 610 of the loading plate 600. As can be seen from the prior art arrangement, the loading plate 600 mounted on the PnP cap 400 does not have any portion latching on to the PnP cap 400, and, as such, the loading plate 600 is independent of any interconnections with the PnP cap 400. The PnP cap 400 may be removed from the socket body 200 after switching the loading plate 600 to first position (open position) as explained in conjunction with FIG. 1C. Similarly, the PnP cap 400 may be re-inserted onto the socket body 200 without coming into contact with the loading plate 600. An arrangement for detachably engaging the loading plate 600 with a PnP cap is explained in conjunction with FIG. 5.

Figure 5:
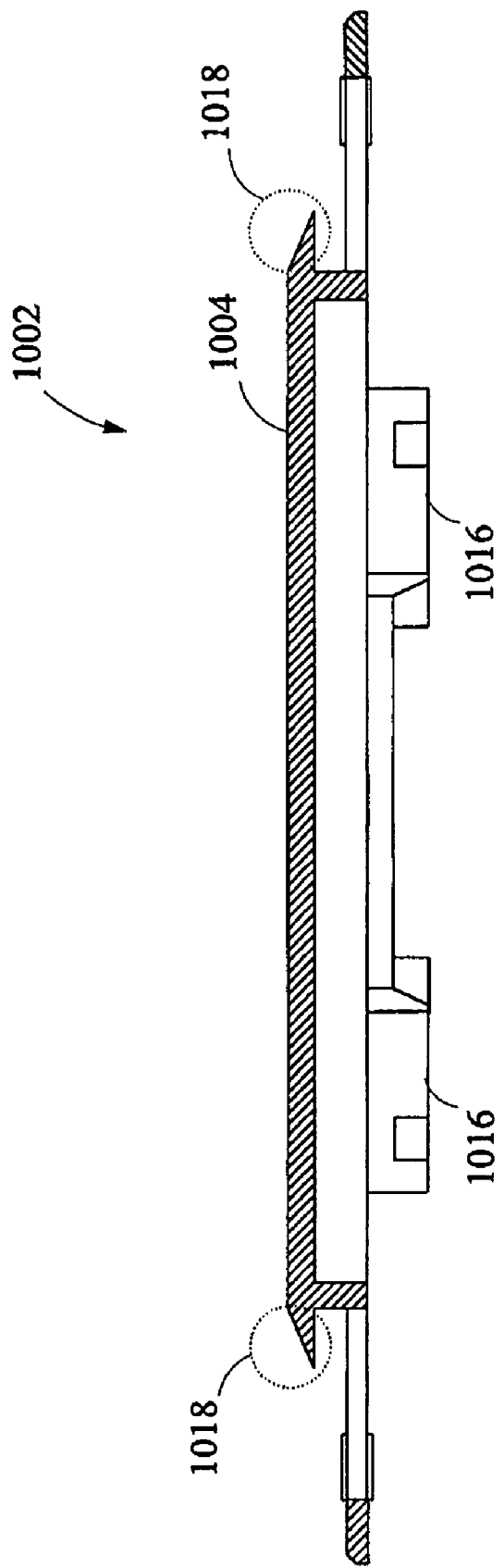
FIG. 5 illustrates an arrangement for detachably engaging the loading plate with a PnP cap, in accordance with an embodiment of the present disclosure.

FIG. 5 illustrates an arrangement for detachably engaging the loading plate 600 (not shown) with a PnP cap 1002, in accordance with an embodiment of the present disclosure. The PnP cap 1002 includes a raised portion 1004 such as raised portion 404, a circular smooth surface (Not Shown) such as circular smooth surface 406, a neck (Not Shown) such as neck portion 408, a protrusion (Not Shown) such as protrusion 410, a marker (Not Shown) such as the marker 412, two openings (Not Shown) such as the openings 414 and two C-shaped protrusions 1016 such as the C-shaped protrusions 416. FIG. 5 depicts a cross-sectional side view of the PnP cap 1002 taken along the central axis of the sides not bearing the protrusion 1010 and C-shaped protrusions 1016. The cross-sectional side view depicts the raised portion 1004 with two protrusions 1018 one on each side of the raised portion 1004 running along a pair of peripheral edges of the PnP cap 1002. The protrusions 1018 further have a tapered edge to facilitate the mounting of the loading plate 600 over the PnP cap 1002. The pair of pressing portions 610 snap over the tapered edge of the protrusions 1018 provided on the raised portion 1004 and gets trapped below the protrusions 1018. The loading plate 600 therefore gets engaged with the PnP cap 1002. The circular smooth surface, the neck, the protrusion and the marker are not shown in the cross-sectional side view. It will be evident to those skilled in the art that the components such as the circular smooth surface, the neck, the protrusion and the marker would have similar arrangement on the PnP cap 1002 as like-wise components on the PnP cap 400. The arrangement of the pressing portion of the pair of pressing portions 610 and the PnP cap 1002 is further depicted in FIG. 6.

Figure 6:
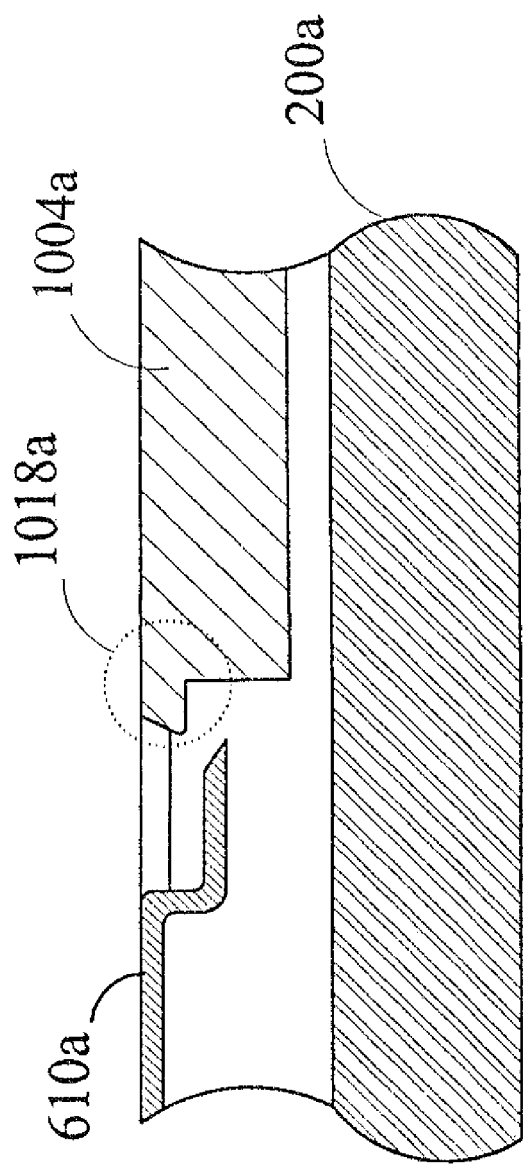
FIG. 6 depicts a cross-sectional view illustrating position of a pressing portion of a pair of pressing portions with respect to the PnP cap, in accordance with an embodiment of the present disclosure.

FIG. 6 depicts a cross-sectional view illustrating the position of the pressing portion of the pair of pressing portions 610 with respect to the PnP cap 1002, in accordance with an embodiment of the present disclosure. The shaded portion 610a represents a cross-sectional view of a pressing portion of the pair of pressing portions 610 of the loading plate 600.

Shaded portion 1004a represents a cross-sectional view of the raised portion 1004 of the PnP cap 1002 with the protrusion 1018a (cross-sectional view of one of the protrusions 1018) having a tapered edge. Shaded portion 200a represents a cross-sectional view of the socket body 200. As can be seen from FIG. 6, the pressing portion of the pair of pressing portions 610 slides over the tapered portion of one of the protrusions 1018 of the raised portion of the PnP cap 1002 and gets engaged with the PnP cap 1002. The loading plate 600 thus gets engaged with the PnP cap 1002. The removal of the PnP cap 1002 now requires only moving the loading plate 600 to the open position (as explained in conjunction with FIG. 1C). Further, the re-insertion of the PnP cap 1002 requires lowering the loading plate 600 to the closed position, thereby precluding manual intervention which may result in damage to the array of contacts on the first surface 202 of the socket body 200.

In accordance with an embodiment of the present disclosure, a socket body such as the socket body 200, a socket body frame such as the socket body frame 300 and a loading mechanism such as the loading mechanism 500 configure a land grid array socket. A PnP cap such as PnP cap 1002 may be removably attached to the peripheral walls of the socket body for covering a first surface such as the first surface 202 of the socket body. The loading mechanism includes a loading plate such as the loading plate 600 and may be mounted over the socket body and the PnP cap. The PnP cap may have a raised portion such as the raised portion 1004. The raised portion of the PnP cap has at least one protrusion configured for engaging the loading plate, when the loading plate is mounted over the PnP cap. The engaging of the PnP cap with the loading plate prevents damage to array of contacts of the socket body due to improper re-insertion of the PnP cap.

In accordance with an embodiment of the present disclosure, the loading mechanism (also referred to as independent loading mechanism) is designed to accommodate various IC package thicknesses. Further, the independent loading mechanism also is configured to apply load onto an integrated heat spreader (IHS) in two points. Moreover, the independent loading mechanism is designed to provide minimum contact force required for meeting the low level circuit resistance (LLCR) requirements throughout the land grid array socket life.

The foregoing descriptions of specific embodiments of the present disclosure have been presented for purposes of illustration and description. They are not intended to be exhaustive or to limit the present disclosure to the precise forms disclosed, and obviously many modifications and variations are possible in light of the above teaching. The embodiments were chosen and described in order to best explain the principles of the present disclosure and its practical application, to thereby enable others skilled in the art to best utilize the disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. An electrical connector assembly for electrically engaging an integrated circuit (IC) package with a printed circuit board (PCB), the electrical connector assembly comprising:
    a socket body comprising an array of contacts on a first surface for electrically engaging the IC package, the socket body capable of being surface mounted on the PCB;
    a pick-and-place (PnP) cap capable of being removably attached to a periphery of the socket body, the PnP cap configured to cover the first surface of the socket body; and
    a loading mechanism comprising a loading plate capable of being mounted over the socket body and the PnP cap,
    wherein the PnP cap is further capable of detachably engaging the loading plate while mounting the loading plate over the PnP cap; and wherein the PnP cap comprises at least one protrusion configured on a raised portion of the PnP cap to detachably engage the loading plate.

2. The electrical connector assembly of claim 1, wherein the loading mechanism further comprises a lever.

3. The electrical connector assembly of claim 2, wherein the loading plate is further capable of assuming one of a first position and a second position using the lever.

4. The electrical connector assembly of claim 1, further comprising a socket body frame capable of housing the socket body for surface mounting the socket body on the PCB.

5. The electrical connector assembly of claim 1, wherein the PnP cap is molded using liquid-crystal-polymer (LCP) material.

6. An electrical connector assembly for electrically engaging an integrated circuit (IC) package with a printed circuit board (PCB), the electrical connector assembly comprising:
    a land grid array socket, the land grid array socket comprising
        a socket body comprising an array of contacts on a first surface for electrically engaging the IC package, and
        a loading mechanism comprising a loading plate capable of being mounted over the socket body; and
    a pick-and-place (PnP) cap capable of being removably attached to a periphery of the socket body, the PnP cap configured to cover a first surface of the socket body of the land grid array socket,
    wherein the PnP cap is further capable of detachably engaging the loading plate while mounting the loading plate over the PnP cap, and
    wherein the land grid array socket is capable of being surface mounted on the PCB; and wherein the PnP cap comprises at least one protrusion configured on a raised portion of the PnP cap to detachably engage the loading plate.

7. The electrical connector assembly of claim 6, wherein the loading mechanism of the land grid array socket further comprises a lever.

8. The electrical connector assembly of claim 7, wherein the loading plate is further capable of assuming one of a first position and a second position using the lever.

9. The electrical connector assembly of claim 6, wherein the land grid array socket further comprises a socket body frame capable of housing the socket body.

10. The electrical connector assembly of claim 6, wherein the PnP cap is molded using liquid-crystal-polymer (LCP) material.

* * * * *